US012677466B2

(12) United States Patent
Sun et al.

(10) Patent No.: US 12,677,466 B2
(45) Date of Patent: Jul. 7, 2026

(54) DEEPLY RECESSED TOP METAL GATE FOR GATE-ALL-AROUND FIELD EFFECT TRANSISTOR

(71) Applicant: QUALCOMM Incorporated, San Diego, CA (US)

(72) Inventors: Yan Sun, San Diego, CA (US); Shreesh Narasimha, Charlotte, NC (US)

(73) Assignee: QUALCOMM INCORPORATED, San Diego, CA (US)

( * ) Notice: Subject to any disclaimer, the term of this patent is extended or adjusted under 35 U.S.C. 154(b) by 360 days.

(21) Appl. No.: 18/584,903

(22) Filed: Feb. 22, 2024

(65) Prior Publication Data

US 2025/0275215 A1 Aug. 28, 2025

(51) Int. Cl.
| | |
|---|---|
| *H01L 29/06* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| *H10D 64/23* | (2025.01) |

(52) U.S. Cl.
CPC ......... *H10D 64/258* (2025.01); *H10D 30/014* (2025.01); *H10D 30/43* (2025.01); *H10D 30/6735* (2025.01); *H10D 62/121* (2025.01); *H10D 64/01* (2025.01); *H10D 64/017* (2025.01)

(58) Field of Classification Search
CPC .. H10D 30/014; H10D 30/43; H10D 30/6735; H10D 62/121; H10D 64/01; H10D 64/017; H10D 64/258
See application file for complete search history.

(56) References Cited

U.S. PATENT DOCUMENTS

| | | | | |
|---|---|---|---|---|
| 11,664,377 | B2 * | 5/2023 | Lilak ...................... | H10D 84/85 |
| | | | | 257/499 |
| 11,955,527 | B2 * | 4/2024 | Cheng .................. | H10D 62/118 |
| 2020/0266060 | A1 * | 8/2020 | Cheng .................. | H10D 64/017 |
| 2020/0350215 | A1 * | 11/2020 | Zhang .................. | H10D 64/017 |
| 2022/0102346 | A1 * | 3/2022 | Lilak ...................... | H10D 84/85 |
| 2024/0203991 | A1 * | 6/2024 | Mochizuki ......... | H10D 84/0186 |
| 2024/0222447 | A1 * | 7/2024 | Patel .................. | H10D 30/6729 |
| 2024/0347635 | A1 * | 10/2024 | Chiang .............. | H10D 30/6757 |
| 2025/0133763 | A1 * | 4/2025 | Chen .................. | H10D 30/502 |
| 2025/0212472 | A1 * | 6/2025 | Mochizuki ........... | H10D 62/834 |

* cited by examiner

*Primary Examiner* — Jaehwan Oh
(74) *Attorney, Agent, or Firm* — Muncy, Geissler, Olds & Lowe, P.C.

(57) ABSTRACT

A field effect transistor (FET) structure and method for making the same is disclosed. In an aspect, a FET structure comprises a vertical metal gate disposed between a first and second source/drain (S/D) epitaxial (EPI) structure and having a set of vertically-stacked, horizontal channels connecting the first and second S/D EPI structures through the vertical metal gate, where a top-most portion of the vertical metal gate is above a top-most channel. A high-K dielectric material is disposed between the vertical metal gate and each of the horizontal channels, and vertical spacer layers separate the vertical metal gate from the S/D EPI structures. A low-K dielectric structure is disposed above the top-most portion of the vertical metal gate and fills a recess above the vertical metal gate and between the first vertical spacer layer and the second vertical spacer layer.

14 Claims, 9 Drawing Sheets

Cross-section A-A

Cross-section B-B

Cross-section A-A

Cross-section B-B

Cross-section A-A

Legend:

| | | |
|---|---|---|
| Si | Poly | Cap |
| Si/Ge | Spacer | Etch Stop |
| S/D EPI | MG | HKD |
| ILD | | |

Inner spacer formation

Etch stop formation / EPI formation

Replacement metal gate formation / ILD / CMP x z y

Top gate recess etch

Backfill dielectric

ILD deposition, CMP, FSDC formation

Legend:

| Si | HKD | ILD |
| MG | STI | |
| HKD | LKD | |

Cross-section through a gate stack
with additional top etch

Cross-section through a gate stack

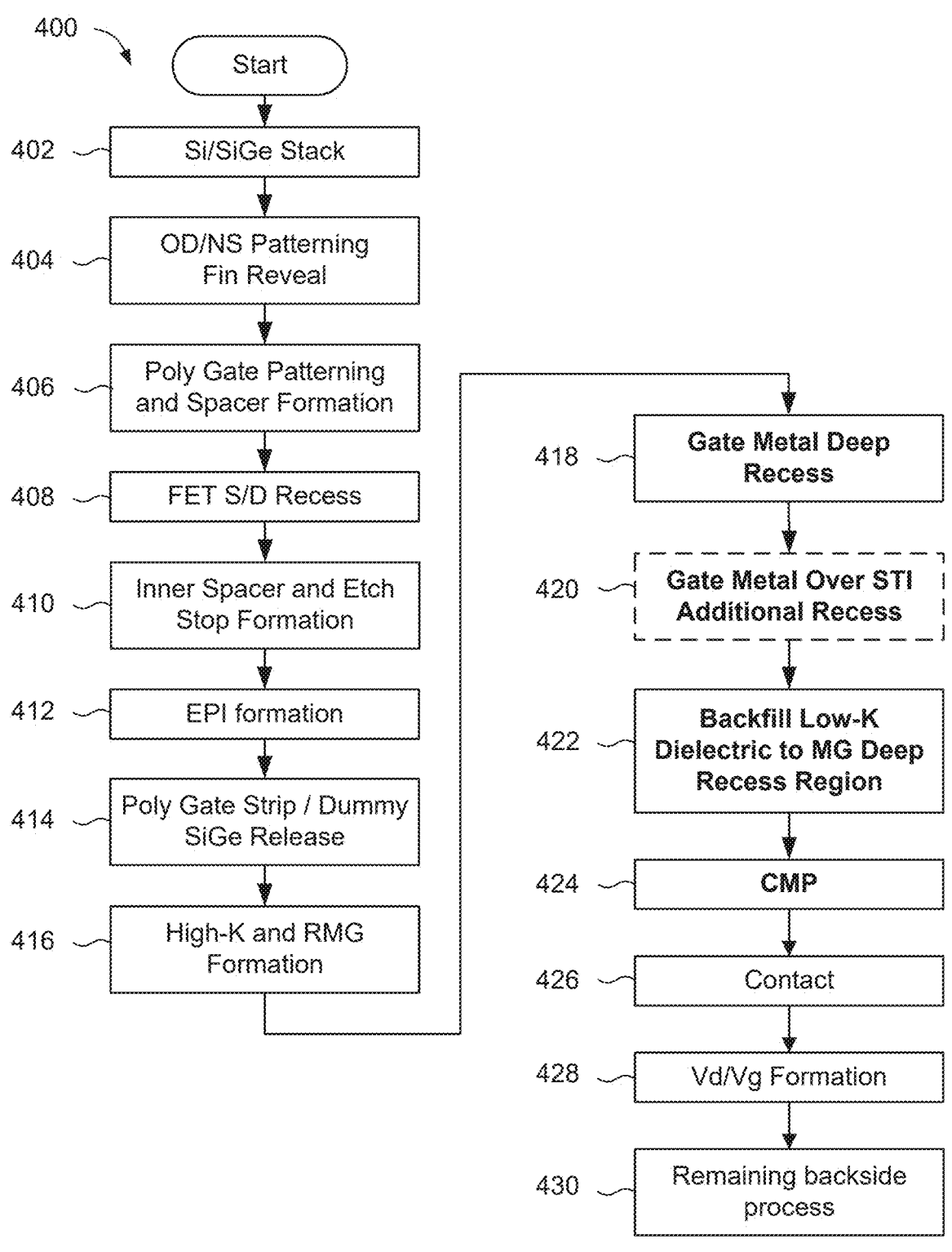

400

Start

402 — Si/SiGe Stack

404 — OD/NS Patterning Fin Reveal

406 — Poly Gate Patterning and Spacer Formation

408 — FET S/D Recess

410 — Inner Spacer and Etch Stop Formation

412 — EPI formation

414 — Poly Gate Strip / Dummy SiGe Release

416 — High-K and RMG Formation

418 — Gate Metal Deep Recess

420 — Gate Metal Over STI Additional Recess

422 — Backfill Low-K Dielectric to MG Deep Recess Region

424 — CMP

426 — Contact

428 — Vd/Vg Formation

430 — Remaining backside process

*FIG. 4*

500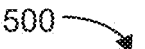

510 — Provide a vertical metal gate structure extending in a first horizontal direction and having a first portion disposed between a first S/D EPI structure and a second S/D EPI structure set apart in a second horizontal direction and comprising a first channel structure, the first channel structure comprising a first plurality of vertically-stacked, horizontal channels connecting the first S/D EPI structure to the second S/D EPI structure in the second horizontal direction through the first portion of the vertical metal gate structure, wherein a top-most portion of the vertical metal gate structure is above a first top-most channel of the first plurality of vertically-stacked, horizontal channels 520 — Provide a high-K dielectric material disposed between the vertical metal gate structure and each of the first plurality of vertically-stacked, horizontal channels 530 — Provide a first vertical spacer layer extending in the first horizontal direction and disposed between the vertical metal gate structure and the first S/D EPI structure 540 — Provide a second vertical spacer layer extending in the first horizontal direction and disposed between the vertical metal gate structure and the second S/D EPI structure 550 — Provide a low-K dielectric structure disposed above the top-most portion of the vertical metal gate structure and between the first vertical spacer layer and the second vertical spacer layer.

*FIG. 5*

DEEPLY RECESSED TOP METAL GATE FOR GATE-ALL-AROUND FIELD EFFECT TRANSISTOR

BACKGROUND OF THE DISCLOSURE

1. Field of the Disclosure

This disclosure relates generally to semiconductor wafer process, and more specifically to deeply recessed top metal gate for gate-all-around (GAA) field effect transistor (FET) structures and methods for making the same.

2. Description of the Related Art

Integrated circuit (IC) technology has achieved great strides in advancing computing power through miniaturization of electrical components. An IC device may be implemented in the form of an IC chip that has a set of circuits integrated thereon, including a plurality of active and passive components (e.g., transistors, diodes, capacitors, inductors, and/or resistors) and layers of contacts and interconnects above the active and passive components. In some aspects, the contacts and interconnects of an IC device are formed on the active and passive components on the front side of the IC device. As the sizes of the IC devices and the sizes of the components formed thereon become smaller, the available area for forming the contacts and interconnects also become smaller. As such, the routing complexity and/or the parasitic resistance and capacitance of the contacts and interconnects may increase and thus the manufacturing cost or the performance of the IC device may be negatively impacted.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a field effect transistor (FET) structure includes a vertical metal gate structure extending in a first horizontal direction and having a first portion disposed between a first source/drain (S/D) epitaxial (EPI) structure and a second S/D EPI structure set apart in a second horizontal direction and comprising a first channel structure, the first channel structure comprising a first plurality of vertically-stacked, horizontal channels connecting the first S/D EPI structure to the second S/D EPI structure in the second horizontal direction through the first portion of the vertical metal gate structure, wherein a top-most portion of the vertical metal gate structure is above a first top-most channel of the first plurality of vertically-stacked, horizontal channels; a high-K dielectric material disposed between the vertical metal gate structure and each of the first plurality of vertically-stacked, horizontal channels; a first vertical spacer layer extending in the first horizontal direction and disposed between the vertical metal gate structure and the first S/D EPI structure; a second vertical spacer layer extending in the first horizontal direction and disposed between the vertical metal gate structure and the second S/D EPI structure; and a low-K dielectric structure disposed above the top-most portion of the vertical metal gate structure and between the first vertical spacer layer and the second vertical spacer layer.

In an aspect, a method of fabricating a FET structure includes providing a vertical metal gate structure extending in a first horizontal direction and having a first portion disposed between a first S/D EPI structure and a second S/D EPI structure set apart in a second horizontal direction and comprising a first channel structure, the first channel structure comprising a first plurality of vertically-stacked, horizontal channels connecting the first S/D EPI structure to the second S/D EPI structure in the second horizontal direction through the first portion of the vertical metal gate structure, wherein a top-most portion of the vertical metal gate structure is above a first top-most channel of the first plurality of vertically-stacked, horizontal channels; providing a high-K dielectric material disposed between the vertical metal gate structure and each of the first plurality of vertically-stacked, horizontal channels; providing a first vertical spacer layer extending in the first horizontal direction and disposed between the vertical metal gate structure and the first S/D EPI structure; providing a second vertical spacer layer extending in the first horizontal direction and disposed between the vertical metal gate structure and the second S/D EPI structure; and providing a low-K dielectric structure disposed above the top-most portion of the vertical metal gate structure and between the first vertical spacer layer and the second vertical spacer layer.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings, wherein like reference numbers represent like parts, which are presented solely for illustration and not limitation of the disclosure.

FIGS. 3A through 3H are cross-sections that illustrate steps in a process for fabricating a semiconductor structure with deeply recessed top metal gates, according to aspects of the disclosure.

FIG. 4 is a flowchart showing a portion of a simplified wafer process for fabricating a semiconductor structure with deeply recessed top metal gates, according to aspects of the disclosure.

FIG. 5 is a flowchart of an example process associated with a semiconductor structure with deeply recessed top metal gates, according to aspects of the disclosure.

Figures 1A, 1B, 1C:
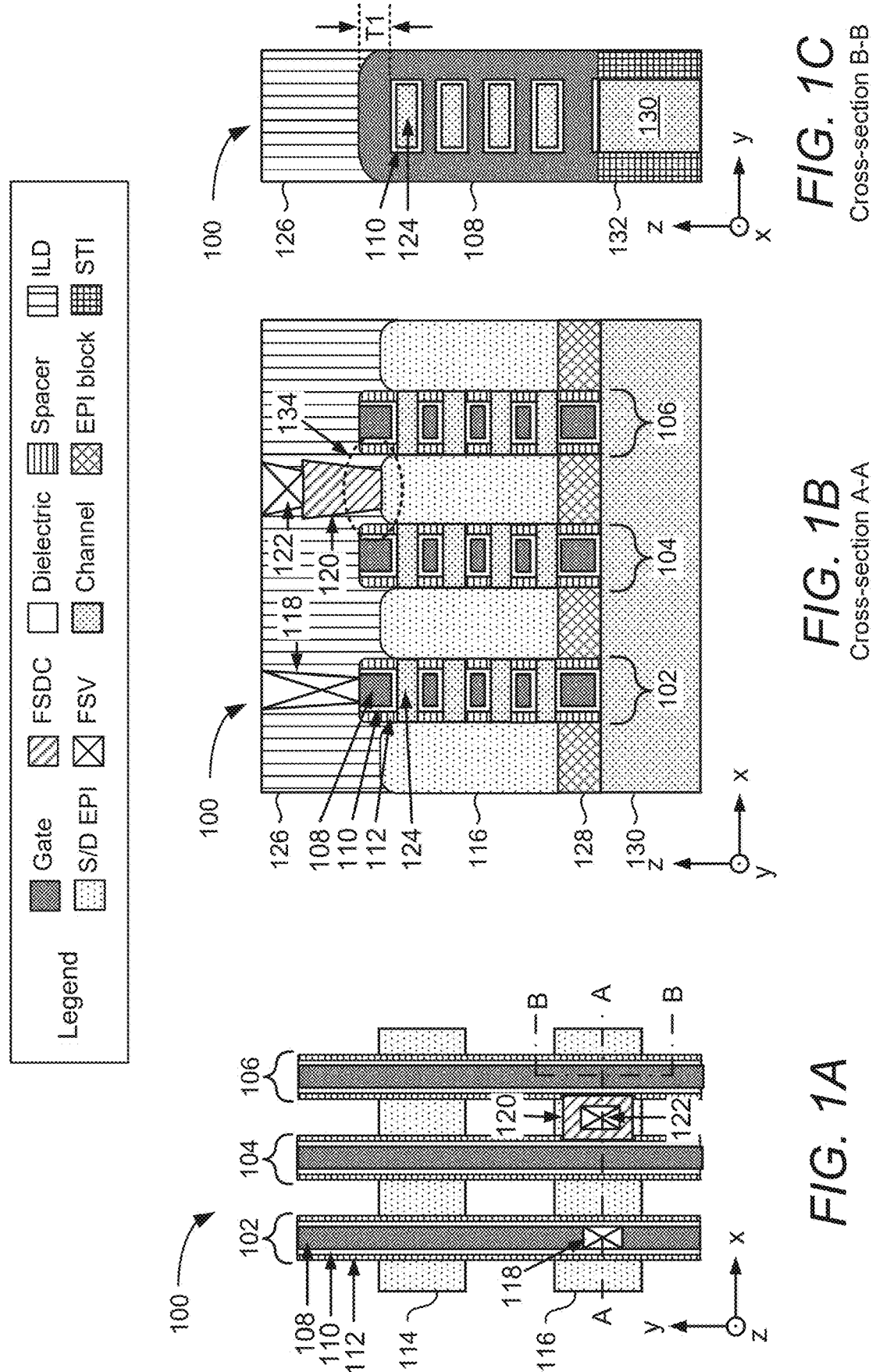
FIGS. 1A, 1B, and 1C are a plan view, a first cross-sectional view, and a second cross-sectional view, respectively, of a conventional semiconductor structure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

A field effect transistor (FET) structure and method for making the same is disclosed. In an aspect, a FET structure comprises a vertical metal gate disposed between a first and second source/drain (S/D) epitaxial (EPI) structure and having a set of vertically-stacked, horizontal channels connecting the first and second S/D EPI structures through the vertical metal gate, where a top-most portion of the vertical metal gate is above a top-most channel. A high-K dielectric material is disposed between the vertical metal gate and each of the horizontal channels, and vertical spacer layers separate the vertical metal gate from the S/D EPI structures. A low-K dielectric structure is disposed above the top-most portion of the vertical metal gate and fills a recess above the vertical metal gate and between the first vertical spacer layer and the second vertical spacer layer.

As used herein, the term "low-K" refers to a material that has a K value between 2.5 and 4.5. Examples of low-K materials include silicon dioxide ($SiO_2$), which has a K value of 3.9, as well as silicon carbon oxynitride (SiCON) and silicon carbonate (SiCO). As used herein, the term "high-K" refers to a material that has a K value that is higher than $SiO_2$, e.g., having a K value that is greater than 7. Examples of high-K materials include, but are not limited to, silicon nitride (Si3N4), which has a K value of approximately 7-10, and hafnium oxide ($HfO_x$), which has a K value of approximately 15 to 25.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

Particular aspects of the subject matter described in this disclosure can be implemented to realize one or more of the following potential advantages. Using a new gate profile with a deeply recessed top metal gate, gate resistance is not limited by the top metal gate but by overall gate profile, especially between nanosheets. Because GAA adopts a volumeless approach for threshold voltage (Vt) tuning, in that both N and P dipole materials are available for multi-Vt designs and a single RMG fill can be used, which enables MG recess control, the deeply recessed top metal gate structure applies to any GAA variant, including fork sheet and complementary FET (CFET) designs. The deeply recessed top metal gate structure also greatly reduces the contact process window and obviates the need for high precision overlay control and contact metallization for very small critical dimensions, which results in a better yield. Moreover, the designs presented herein can be fabricated using existing tools, processes, and materials, making them cost effective. In addition, reduced parasitics, including contact resistance and contact-to-gate capacitance, beneficially reduce standard cell delay and power consumption.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage, or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

FIG. 1A is a plan view of a portion of a semiconductor structure 100 of a conventional integrated circuit (IC) device. In some aspects, FIG. 1A merely shows some elements of the semiconductor structure 100 for illustration purposes, and other elements above and/or below the elements shown in FIG. 1A may be disposed but not shown in FIG. 1A. As shown in FIG. 1A, the semiconductor structure 100 includes gate stacks 102, 104, and 106 spaced along a first direction (e.g., the x direction) and having a length along a second direction (e.g., the y direction). As used herein, the term "gate stack" refers to a structure that includes a metal gate (MG) 108 and which may also include dielectric material 110, spacer 112, and other structural components. As used herein, the terms "gate" and "gate stack" are synonymous unless specifically indicated as otherwise. The semiconductor structure 100 also includes a first region 114 of epitaxial (EPI) source/drain (S/D) structures between the gate stacks and a second region 116 of EPI S/D structures between the gate stacks. The semiconductor structure 100 also includes a first frontside via (FSV) 118, which may also be referred to a gate via (Vg). The semiconductor structure 100 also include a frontside S/D diffusion contact (FSDC) 120, and a second FSV 122, which may also be referred to as diffusion via (Vd).

FIG. 1B is a first cross-sectional view of the semiconductor structure 100 along cut-line A-A. As can be seen in FIG. 1B, each gate cross-section includes the MG 108 through which one or more channels 124 extend, insulated from the MG 108 by the dielectric material 110 and insulated from the EPI structures by the spacer 112. As shown in FIG. 1B, a frontside dielectric stack 126, which may include one or more dielectric layers, one or more of which may be an inter-layer dielectric (ILD) material, covers the tops of the gate stacks and EPI regions. It is through this dielectric stack 126 that the first FSV 118, the FSDC 120, and the second FSV 122 extend. In the example shown in FIG. 1B, an EPI block or etch stop layer 128 surrounds the bottom portion of each gate, and protects the EPI structures during process steps that remove the substrate 130 upon which the structures have been built, e.g., in preparation for creation of a backside power distribution network (BSPDN) or other backside contacts. If the substrate 130 is not removed as part of the fabrication process, then the etch stop layer 128 may be omitted. In some aspects, the substrate 130 may be comprised of silicon, another material, or a combination thereof.

FIG. 1C is a second cross-sectional view of the semiconductor structure 100 along cut-line B-B, showing the shallow trench isolation (STI) structures 132 that isolate each gate stack. As can be seen in FIG. 1C, the MG 108 comprises multiple "fingers" between and around each of the channels 124, and the top finger has a thickness of T1. In the example illustrated in FIG. 1C, T1 is typically in the range of 10-20 nm (e.g., 13 nm), but other thicknesses are also contemplated.

FIG. 1C also illustrates a disadvantage of this conventional structure-namely, that the FSDC 120 is very close to the top gate metal fingers of both gate stack 104 and gate stack 106, shown as region 134 in FIG. 1B. This close proximity increases the parasitic capacitance between the FSDC 120 and the gate stacks on either side of it. Moreover, because the FSDC 120 must not make electrical contact with the gate stacks on either side of it, the process used to create the FSDC 120 must be very precise, which increases the cost of the fabrication process, or else must be undersized to eliminate the possibility of a short between the FSDC 120 and an adjacent gate, which can increase the contact resistance. These challenges will only become greater as process geometries decrease in size, such as the reduction of contacted poly pitch (CPP) of standard cells.

To address these issues, a new gate profile with deeply recessed top gate metal is herein presented. This gate profile may be applied to any gate-all-around (GAA) topology, including, but not limited to forksheet and complementary FET (CFET), for several reasons. First, GAA gate resistance is limited by the overall gate profile, and especially by the portion of the metal gate that is between nanosheet (NS) channel, and not by the geometry of the top portion of the metal gate. Second, GAA adopts a volumeless approach to threshold voltage (VT) tuning. Third, both n-type ("N") and p-type ("P") dipole materials are available for multi-VT designs. Fourth, a single replacement metal gate (RMG) fill process may be used, which enables control of the metal gate recess. Fifth, the contact process window is loosened, which relieves the burden of overlay control and contact metallization having very small critical dimensions and results in better yield. Sixth, the new gate profile may be implemented using known tools, processes, and materials, which makes it cost effective. Seventh, contact parasitics including contact resistance and contact-to-gate capacitance are reduced, which reduces standard cell delay and power consumption.

Figures 2A, 2B, 2C:
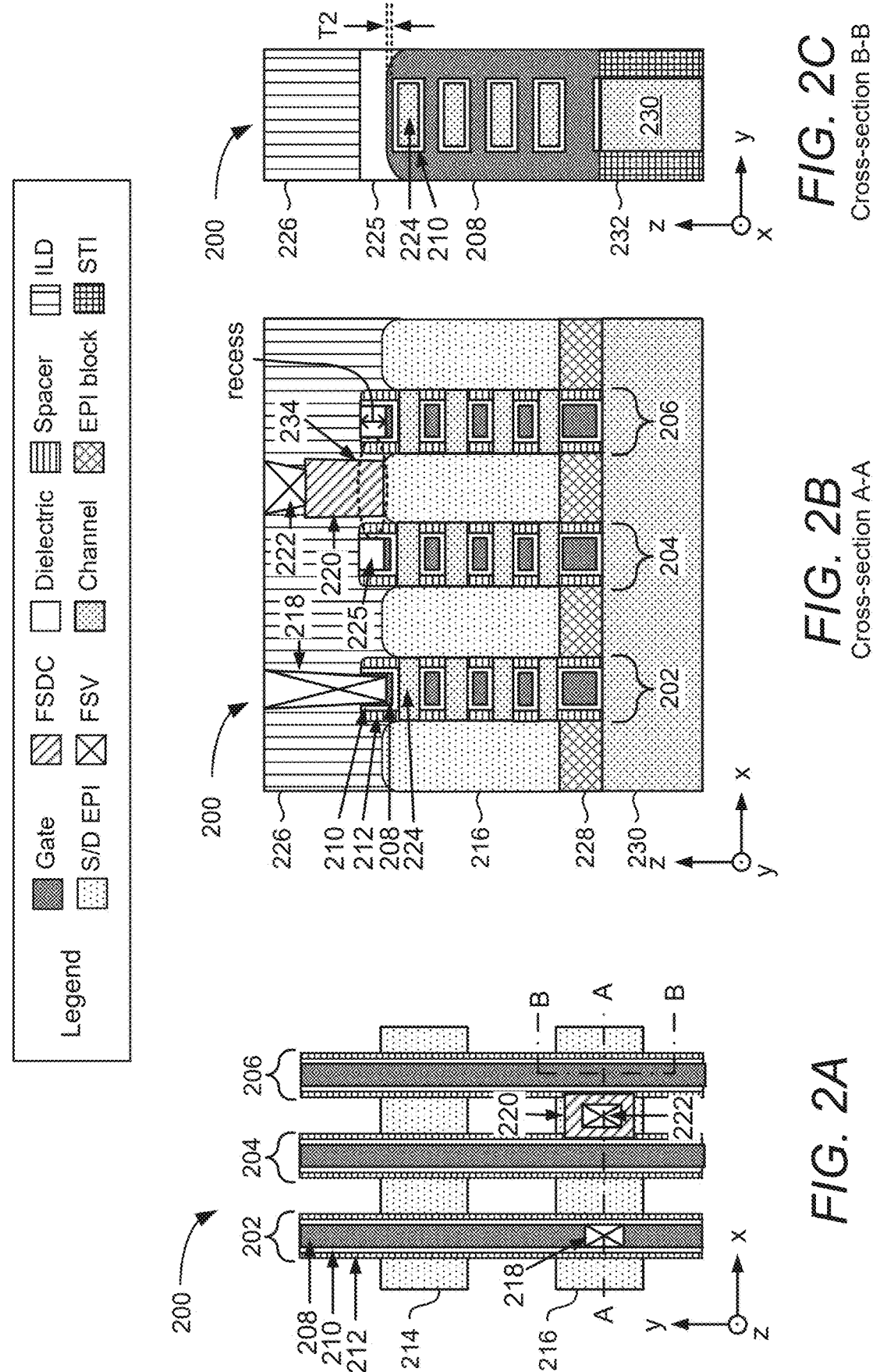
FIGS. 2A, 2B, and 2C are a plan view, a first cross-sectional view, and a second cross-sectional view, respectively, of a semiconductor structure with deeply recessed top metal gates, according to aspects of the disclosure.

FIG. 2A is a plan view of a portion of a semiconductor structure 100 of an IC device with deeply recessed top metal gates, according to aspects of the disclosure. In some aspects, FIG. 2A merely shows some elements of the semiconductor structure 200 for illustration purposes, and other elements above and/or below the elements shown in FIG. 2A may be disposed but not shown in FIG. 2A. As shown in FIG. 2A, the semiconductor structure 200 includes gate stacks 202, 204, and 206 spaced along a first direction (e.g., the x direction) and having a length along a second direction (e.g., the y direction). As used herein, the term "gate stack" refers to a structure that includes an MG structure 208 and which may also include dielectric material 210, a spacer 212, and other structural components. The semiconductor structure 200 also includes a first region 214 of EPI S/D structures between the gate stacks and a second region 216 of EPI S/D structures between the gate stacks. The semiconductor structure 200 also includes a first FSV 218, which may also be referred to a gate via (Vg). The semiconductor structure 200 also include an FSDC 220, and a second FSV 222, which may also be referred to as diffusion via (Vd).

FIG. 2B is a first cross-sectional view of the semiconductor structure 200 along cut-line A-A. As can be seen in FIG. 2B, each gate cross-section includes the MG structure 208 through which one or more channels 224 extend, insulated from the MG structure 208 by the dielectric material 210 and insulated from the EPI structures by the spacer 212. As shown in FIG. 2B, the top finger of the MG structure 208 is deeply recessed and the volume that would have been occupied by gate metal is now filled with a low-K dielectric 225. As shown in FIG. 2B, a frontside dielectric stack 226, which may include one or more dielectric layers, one or more of which may be an ILD material, covers the tops of the gate stacks and EPI regions. It is through this dielectric stack 226 that the first FSV 218, the FSDC 220, and the second FSV 222 extend. As shown in FIG. 2B, an EPI block or etch stop layer 228 surrounds the bottom portion of each gate and protects the EPI structures during process steps that remove the substrate 230 upon which the structures have been built, e.g., in preparation for creation of a backside power distribution network (BSPDN) or other backside contacts. If the substrate 230 is not removed as part of the fabrication process, then the etch stop layer 228 may be omitted. In some aspects, the substrate 230 may be comprised of silicon, another material, or a combination thereof.

FIG. 2C is a second cross-sectional view of the semiconductor structure 200 along cut-line B-B, showing the STI structures 232 that isolate each gate stack. As can be seen in FIG. 2C, the MG structure 208 comprises multiple "fingers" between and around each of the channels 224, and the top finger has a thickness of T2. In the example illustrated in FIG. 2C, T2 is in the range of 2-5 nm (e.g., 3 nm), but other thicknesses are also contemplated. FIG. 2C also illustrates an advantage of this structure-namely, that the FSDC 220 is not very close to the top gate metal fingers of both gate stack 204 and gate stack 206, shown as region 234 in FIG. 2B. This increased distance decreases the parasitic capacitance between the FSDC 220 and the gate stacks on either side of it when compared to the semiconductor structure 100.

In some aspects, the depth of the recess can be controlled with single-type RMG material (e.g., TiN). This was not possible when multi-Vt is implemented by N or P work function metals (WFMs) with various stack thicknesses. As shown in FIGS. 2B and 2C, gate metal is wrapped around the nanosheet channels 224, which means that the top thickness T2 is not a critical component of gate resistance; as long as T2 is at least 2-5 nm to allow for a contact over active gate (COAG) connection, such as the first FSV 218, the gate will function normally.

Figures 3D, 3E, 3F:
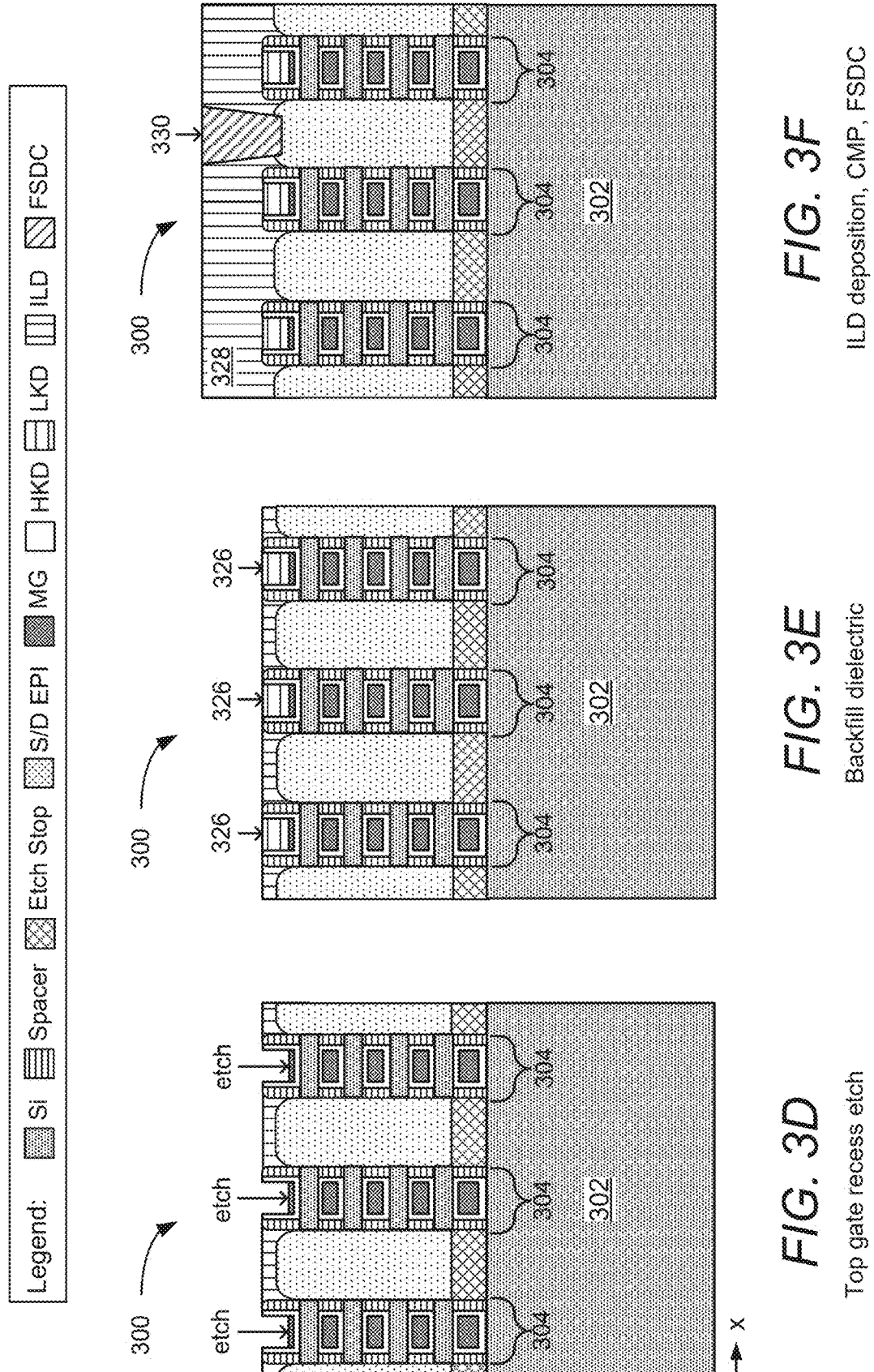
Figures 3G, 3H:
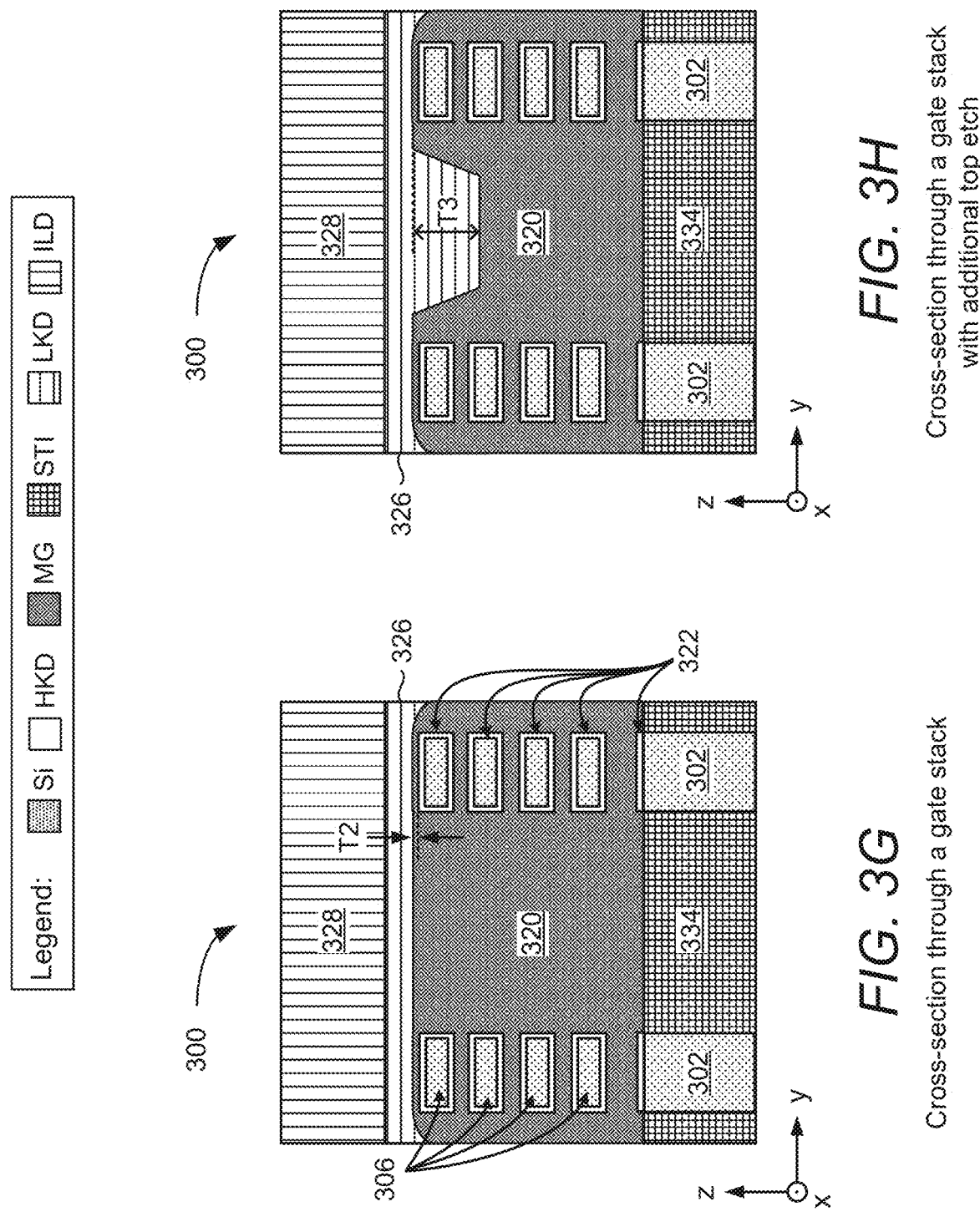

FIGS. 3A-3H are cross-sections that illustrate steps in a process for fabricating a semiconductor structure having deeply recessed top metal gates, according to aspects of the disclosure. FIGS. 3A-3F are cross-sections along the x-direction, and FIGS. 3G-3H are cross-sections along the y-direction. As shown in FIG. 3A, the process starts with a semiconductor structure 300 comprising a silicon substrate 302 upon which have been fabricated a set of gate stacks 304, each gate stack comprising alternating layers of silicon (Si) and silicon/germanium (Si/Ge). The silicon layers 306 will become the channels and the Si/Ge layers 308 will be later replaced by a metal gate. Each gate stack 304 is topped with a polysilicon structure 310 and a cap structure 312 (e.g., a dielectric material). Each gate stack 304 has been subjected to a process to create lateral recesses in which a spacer 314 has been deposited, and further subjected to an etch process that removes the spacer 314 from the bottom of each recess between the gate stacks 304.

FIG. 3B illustrates the result after deposition of an optional etch stop structure 316, which may be a film, at the bottom of each recess, and the growth of EPI structures 318 between each gate stack 304. Materials that can be used for the optional etch stop structure 316 include, but are not limited to, titanium silicide (TiSi), silicon carbon nitride (SiCN), silicon carbon oxynitride (SiCON), aluminum nitride (AlN), area-selective deposition (ASD) dielectrics, SiGe EPI, and other materials that have high etch selectivity to spacer and later backside Si removal.

FIG. 3C illustrates the result after the remainder of the front side process. In the example shown in FIG. 3C, the front side process includes forming an MG structure 320 and high-K dielectric (HKD) structures 322 as well as deposition of an inter-layer dielectric (ILD) layer 324.

FIG. 3D illustrates the result after a top gate recess etch process that creates a deep recess in the top portions of the MG structures 320. In some aspects, the deep recess removes all but 2-5 nm of the top "finger" of the multi-finger MG structure 320.

FIG. 3E illustrates the result after deposition of a low-K dielectric (LKD) within the top gate recesses to create a set of LKD structures 326.

FIG. 3F illustrates the result after deposition of an additional ILD layer 328 (or after the additional growth of the ILD layer 324) and the creation of a FSDC 330.

FIG. 3G illustrates a completed gate stack having a plurality of silicon channels 306 running through the multi-finger MG structure 320 and separated from the MG structure 320 by HKD structures 322. FIG. 3G shows the relative locations of silicon channels 306, the silicon substrate 302, STI structures 334, and an LKD structure 326 below the additional ILD layer 328.

FIG. 3H illustrates a completed gate stack similar to the one illustrated in FIG. 3G, except that in FIG. 3H, the MG structure 320 is subjected to an additional etch step to create an additional recess of the MG structure 320 between the gate stacks, i.e., a gate recess on the metal portion of the gate stack that is above the STI structure 334, shown in FIG. 3H as having a depth T3.

FIG. 4 is a flowchart showing a portion of a simplified wafer process for fabricating a semiconductor structure having deeply recessed top metal gates, according to aspects of the disclosure. As shown in FIG. 4, the process 400 may include, at block 402, forming the Si/SiGe stack, e.g., to create the alternating Si layers 306 and SiGe layers 308 in FIG. 3A.

The process 400 may include performing oxide diffusion/nanosheet patterning and fin reveal (block 404), polysilicon gate patterning (block 406), and creating FET S/D recesses (block 408), e.g., to create the gate stacks 304 with recesses between them, as shown in FIG. 3A.

The process 400 may include deposition of a spacer and deposition of an etch stop structure (block 410), e.g., such as spacers 314 in FIG. 3A and the etch stop structures 316 shown in FIG. 3B.

The process 400 may include formation of S/D EPI structures (block 412), e.g., the S/D EPI structures 318 shown in FIG. 3B.

The process 400 may include performing a poly gate strip and dummy SiGe release process (block 414) and a high-K dielectric and replacement metal gate process (block 416), e.g., to create the MG structures 320 and the HKD structures 322 shown in FIG. 3C.

The process 400 may include performing a gate metal deep recess process (block 418), e.g., to create the deeply etched top gate metal shown in FIG. 3D and having the gate profile shown in FIG. 3G.

In some aspects, the process 400 may optionally perform gate metal over STI additional recess process (block 420), e.g., to create a gate having the gate profile shown in FIG. 3H.

The process 400 may include backfilling the gate metal deep recesses with a low-K dielectric (block 422) followed by a CMP process (block 424), e.g., to create the LKD structures 326 in FIG. 3E.

The process 400 may include formation of contacts (block 426) and Vd/Vg formation (block 428), followed by the remaining steps of the back-end-of-line (BEOL) process (block 430).

The deeply recessed top metal gates described herein provide a number of advantages. For example, one advantage is that the contact-to-gate-overlay margin can be widened significantly, since there is no gate metal next to most of the contact etch path, as can be seen in region 234. As a result, the frontside S/D contacts (e.g., FSDC 220 in FIG. 3B) may be larger, which reduces the contact resistance. Contact-to-gate parasitic cap is reduced as well, because most of the top of the metal gate (e.g., MG structures 208 and 320) has been replaced with a low-K dielectric (e.g., the LKD structures 225 and 326). In some aspects, a Vg (e.g., the first FSV 218) will require a deeper etch to reach the top surface of the MG structure, but this is unlikely to be a process bottleneck because Vg contact resistance is not critical and because a direct, bottom-up metallization may be used to create a Vg since it is built upon a metal surface.

FIG. 5 is a flowchart of an example process 500 associated with deeply recessed top metal gates, according to aspects of the disclosure.

As shown in FIG. 5, process 500 may include, at block 510, providing a vertical metal gate structure extending in a first horizontal direction and having a first portion disposed between a first S/D EPI structure and a second S/D EPI structure set apart in a second horizontal direction and comprising a first channel structure, the first channel structure comprising a first plurality of vertically-stacked, horizontal channels connecting the first S/D EPI structure to the second S/D EPI structure in the second horizontal direction through the first portion of the vertical metal gate structure, wherein a top-most portion of the vertical metal gate structure is above a first top-most channel of the first plurality of vertically-stacked, horizontal channels.

As further shown in FIG. 5, process 500 may include, at block 520, providing a high-K dielectric material disposed between the vertical metal gate structure and each of the first plurality of vertically-stacked, horizontal channels.

As further shown in FIG. 5, process 500 may include, at block 530, providing a first vertical spacer layer extending in the first horizontal direction and disposed between the vertical metal gate structure and the first S/D EPI structure.

As further shown in FIG. 5, process 500 may include, at block 540, providing a second vertical spacer layer extending in the first horizontal direction and disposed between the vertical metal gate structure and the second S/D EPI structure.

As further shown in FIG. 5, process 500 may include, at block 550, providing a low-K dielectric structure disposed above the top-most portion of the vertical metal gate structure and between the first vertical spacer layer and the second vertical spacer layer.

In some aspects, providing the low-K dielectric structure comprises filling a recess formed by the first vertical spacer layer, the second vertical spacer layer, and the top-most portion of the vertical metal gate structure.

In some aspects, providing the vertical metal gate structure comprises providing a gate-all-around (GAA) structure.

In some aspects, process 500 includes providing a frontside inter-layer dielectric (ILD) layer disposed above the vertical metal gate structure, the first S/D EPI structure, and the second S/D EPI structure.

In some aspects, process 500 includes providing a second portion of the vertical metal gate structure is disposed between a third S/D EPI structure and a fourth S/D EPI structure set apart in the second horizontal direction and set apart from the first S/D EPI structure and the second S/D EPI structure in the first horizontal direction and comprising a second channel structure, the second channel structure comprising a second plurality of vertically-stacked, horizontal channels connecting the third S/D EPI structure to the fourth S/D EPI structure in the second horizontal direction through the vertical metal gate structure, wherein the top-most portion of the vertical metal gate structure is above a second top-most channel of the second plurality of vertically-stacked, horizontal channels.

In some aspects, the vertical metal gate structure comprises a third portion between the first portion of the vertical metal gate structure and the second portion of the vertical metal gate structure, wherein a top surface of the third portion of the vertical metal gate structure is below a top surface of the first portion of the vertical metal gate structure.

In some aspects, the top surface of the third portion is below the first top-most channel of the first plurality of vertically-stacked, horizontal channels.

Process 500 may include additional implementations, such as any single implementation or any combination of implementations described below and/or in connection with one or more other processes described elsewhere herein. Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
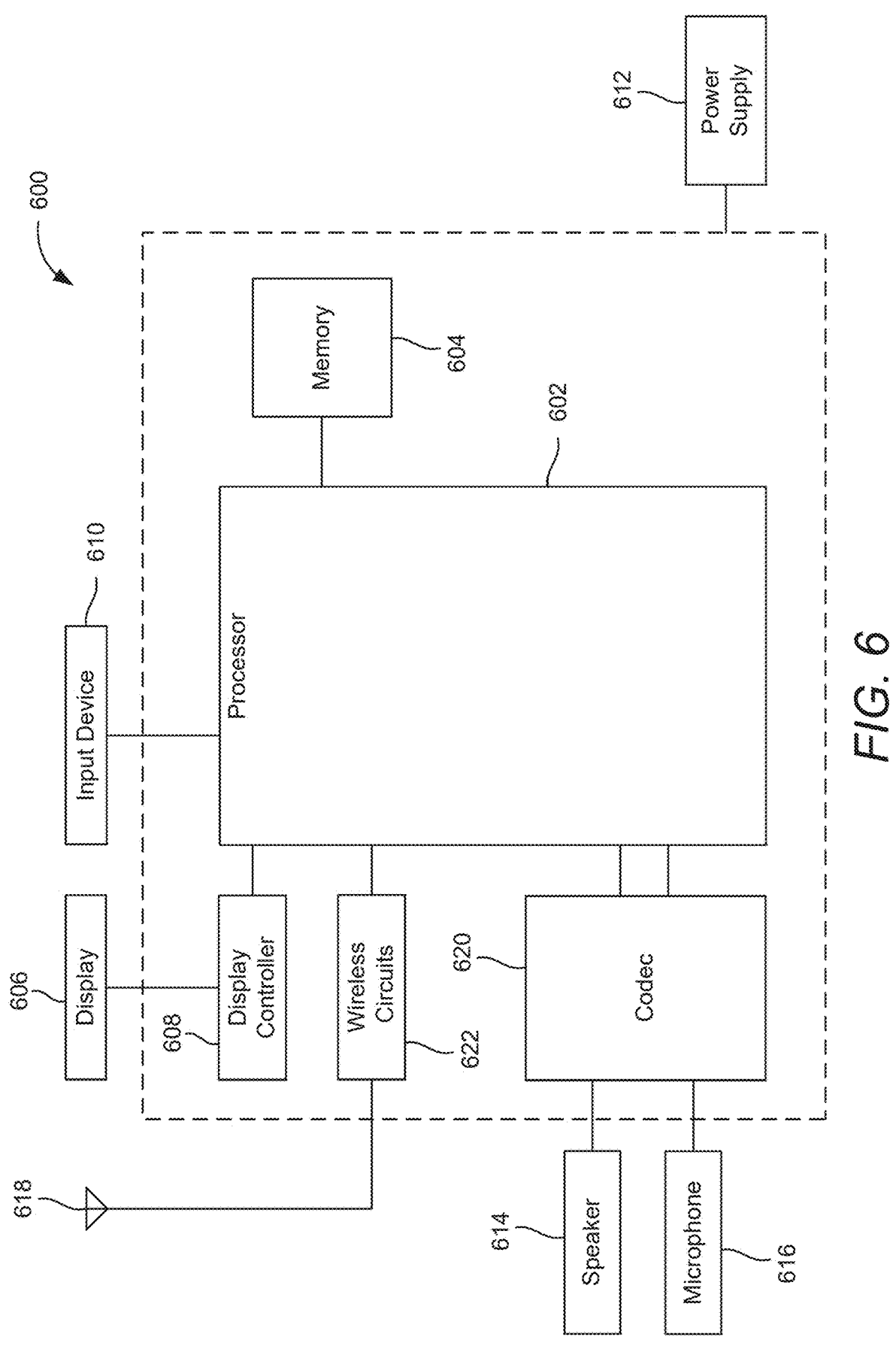
FIG. 6 illustrates a mobile device in accordance with some examples of the disclosure.

FIG. 6 illustrates a mobile device 600, according to aspects of the disclosure. In some aspects, the mobile device 600 may be implemented by including one or more IC devices manufactured based on the examples described in this disclosure.

In some aspects, mobile device 600 may be configured as a wireless communication device. As shown, mobile device 600 includes processor 602. Processor 602 may be communicatively coupled to memory 604 over a link, which may be a die-to-die or chip-to-chip link. Mobile device 600 also includes display 606 and display controller 608, with display controller 608 coupled to processor 602 and to display 606. The mobile device 600 may include input device 610 (e.g., physical, or virtual keyboard), power supply 612 (e.g., battery), speaker 614, microphone 616, and wireless antenna 618. In some aspects, the power supply 612 may directly or indirectly provide the supply voltage for operating some or all of the components of the mobile device 600.

In some aspects, FIG. 6 may include coder/decoder (CODEC) 620 (e.g., an audio and/or voice CODEC) coupled to processor 602; speaker 614 and microphone 616 coupled to CODEC 620; and wireless circuits 622 (which may include a modem, RF circuitry, filters, etc.) coupled to wireless antenna 618 and to processor 602.

In some aspects, one or more of processor 602, display controller 608, memory 604, CODEC 620, and wireless circuits 622 may include one or more IC devices including semiconductor structures manufactured according to the examples described in this disclosure.

It should be noted that although FIG. 6 depicts a mobile device 600, similar architecture may be used to implement an apparatus including a set top box, a music player, a video player, an entertainment unit, a navigation device, a personal digital assistant (PDA), a fixed location data unit, a computer, a laptop, a tablet, a communications device, a mobile phone, or other similar devices.

Figure 7:
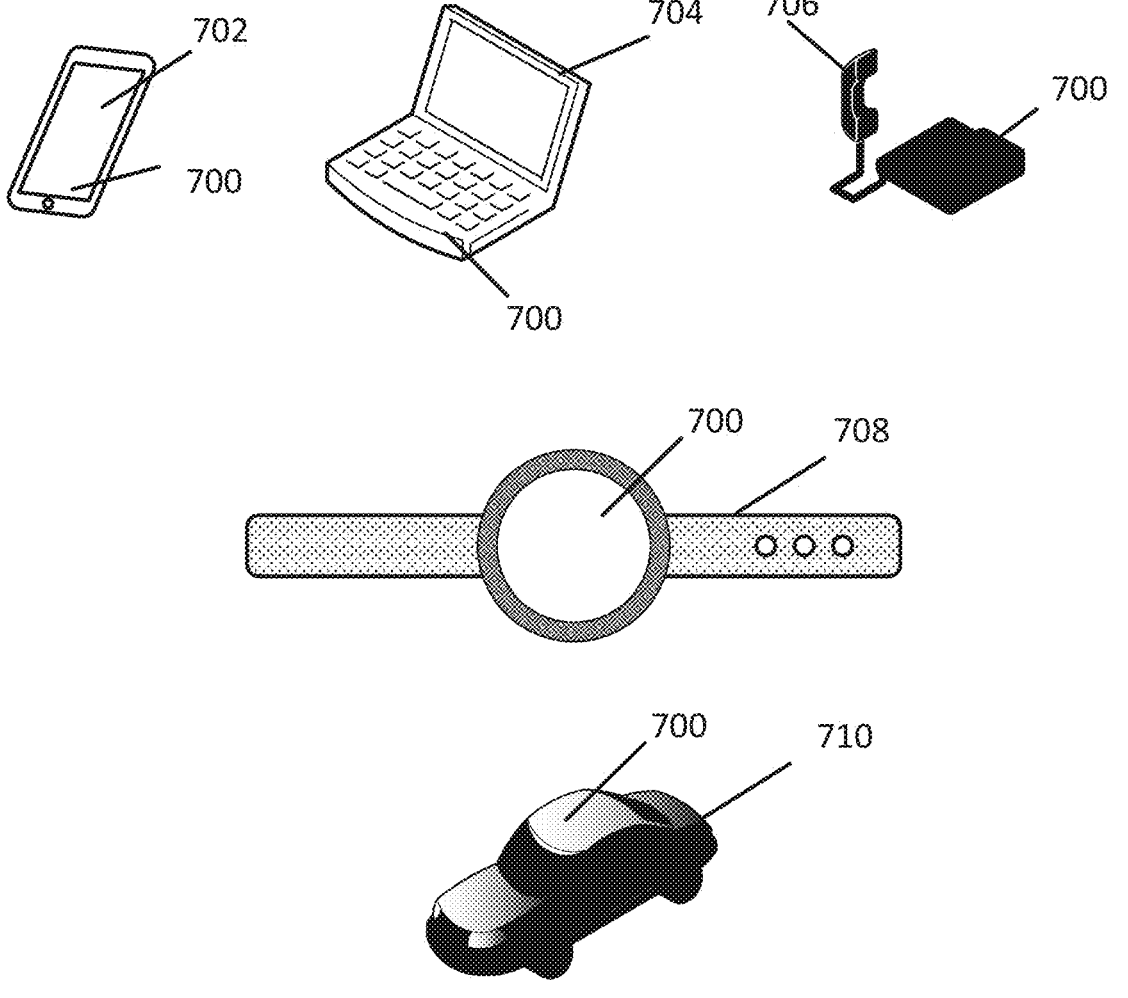
FIG. 7 illustrates various electronic devices that may be integrated with any of the aforementioned integrated device or semiconductor device in accordance with various examples of the disclosure.

FIG. 7 illustrates various electronic devices that may be integrated with any of the aforementioned devices, semiconductor devices, integrated circuit (IC) packages, integrated circuit (IC) devices, semiconductor devices, integrated circuits, electronic components, interposer packages, package-on-package (POP), System in Package (SiP), or System on Chip (SoC). For example, a mobile phone device 702, a laptop computer device 704, a fixed location terminal device 706, a wearable device 708, or automotive vehicle 710 may include a semiconductor device 700 (e.g., semiconductor structure 200, semiconductor structure 300) as described herein. The devices 702, 704, 706 and 708 and the vehicle 710 illustrated in FIG. 7 are merely exemplary. Other apparatuses or devices may also feature the semiconductor device 700 including, but not limited to, a group of devices that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. A field effect transistor (FET) structure, comprising: a vertical metal gate structure extending in a first horizontal direction and having a first portion disposed between a first source/drain (S/D) epitaxial (EPI) structure and a second S/D EPI structure set apart in a second horizontal direction and comprising a first channel structure, the first channel structure comprising a first plurality of vertically-stacked, horizontal channels connecting the first S/D EPI structure to the second S/D EPI structure in the second horizontal direction through the first portion of the vertical metal gate structure, wherein a top-most portion of the vertical metal gate structure is above a first top-most channel of the first plurality of vertically-stacked, horizontal channels; a high-K dielectric material disposed between the vertical metal gate structure and each of the first plurality of vertically-stacked, horizontal channels; a first vertical spacer layer extending in the first horizontal direction and disposed between the vertical metal gate structure and the first S/D EPI structure; a second vertical spacer layer extending in the first horizontal direction and disposed between the vertical metal gate structure and the second S/D EPI structure; and a low-K dielectric structure disposed above the top-most portion of the vertical metal gate structure and between the first vertical spacer layer and the second vertical spacer layer.

Clause 2. The FET structure of clause 1, wherein the low-K dielectric structure fills a recess formed by the first vertical spacer layer, the second vertical spacer layer, and the top-most portion of the vertical metal gate structure.

Clause 3. The FET structure of any of clauses 1 to 2, wherein the vertical metal gate structure comprises a gate-all-around (GAA) structure.

Clause 4. The FET structure of any of clauses 1 to 3, further comprising a frontside inter-layer dielectric (ILD) layer disposed above the vertical metal gate structure, the first S/D EPI structure, and the second S/D EPI structure.

Clause 5. The FET structure of any of clauses 1 to 4, wherein a second portion of the vertical metal gate structure is disposed between a third S/D EPI structure and a fourth S/D EPI structure set apart in the second horizontal direction and set apart from the first S/D EPI structure and the second S/D EPI structure in the first horizontal direction and comprising a second channel structure, the second channel structure comprising a second plurality of vertically-stacked, horizontal channels connecting the third S/D EPI structure to the fourth S/D EPI structure in the second horizontal direction through the vertical metal gate structure, wherein the top-most portion of the vertical metal gate structure is above a second top-most channel of the second plurality of vertically-stacked, horizontal channels.

Clause 6. The FET structure of clause 5, wherein the vertical metal gate structure comprises a third portion between the first portion of the vertical metal gate structure and the second portion of the vertical metal gate structure, wherein a top surface of the third portion of the vertical metal gate structure is below a top surface of the first portion of the vertical metal gate structure.

Clause 7. The FET structure of clause 6, wherein the top surface of the third portion is below the first top-most channel of the first plurality of vertically-stacked, horizontal channels.

Clause 8. A method of fabricating a field effect transistor (FET) structure, the method comprising: providing a vertical metal gate structure extending in a first horizontal direction and having a first portion disposed between a first source/drain (S/D) epitaxial (EPI) structure and a second S/D EPI structure set apart in a second horizontal direction and comprising a first channel structure, the first channel structure comprising a first plurality of vertically-stacked, horizontal channels connecting the first S/D EPI structure to the second S/D EPI structure in the second horizontal direction through the first portion of the vertical metal gate structure, wherein a top-most portion of the vertical metal gate structure is above a first top-most channel of the first plurality of vertically-stacked, horizontal channels; providing a high-K dielectric material disposed between the vertical metal gate structure and each of the first plurality of vertically-stacked, horizontal channels; providing a first vertical spacer layer extending in the first horizontal direction and disposed between the vertical metal gate structure and the first S/D EPI structure; providing a second vertical spacer layer extending in the first horizontal direction and disposed between the vertical metal gate structure and the second S/D EPI structure; and providing a low-K dielectric structure disposed above the top-most portion of the vertical metal gate structure and between the first vertical spacer layer and the second vertical spacer layer.

Clause 9. The method of clause 8, wherein providing the low-K dielectric structure comprises filling a recess formed by the first vertical spacer layer, the second vertical spacer layer, and the top-most portion of the vertical metal gate structure.

Clause 10. The method of any of clauses 8 to 9, wherein providing the vertical metal gate structure comprises providing a gate-all-around (GAA) structure.

Clause 11. The method of any of clauses 8 to 10, further comprising providing a frontside inter-layer dielectric (ILD) layer disposed above the vertical metal gate structure, the first S/D EPI structure, and the second S/D EPI structure.

Clause 12. The method of any of clauses 8 to 11, further comprising: providing a second portion of the vertical metal gate structure is disposed between a third S/D EPI structure and a fourth S/D EPI structure set apart in the second horizontal direction and set apart from the first S/D EPI structure and the second S/D EPI structure in the first horizontal direction and comprising a second channel structure, the second channel structure comprising a second plurality of vertically-stacked, horizontal channels connecting the third S/D EPI structure to the fourth S/D EPI structure in the second horizontal direction through the vertical metal gate structure, wherein the top-most portion of the vertical metal gate structure is above a second top-most channel of the second plurality of vertically-stacked, horizontal channels.

Clause 13. The method of clause 12, wherein the vertical metal gate structure comprises a third portion between the first portion of the vertical metal gate structure and the second portion of the vertical metal gate structure, wherein a top surface of the third portion of the vertical metal gate structure is below a top surface of the first portion of the vertical metal gate structure.

Clause 14. The method of clause 13, wherein the top surface of the third portion is below the first top-most channel of the first plurality of vertically-stacked, horizontal channels.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A field effect transistor (FET) structure, comprising:
a vertical metal gate structure extending in a first horizontal direction and having a first portion disposed between a first source/drain (S/D) epitaxial (EPI) structure and a second S/D EPI structure set apart in a second horizontal direction and comprising a first channel structure, the first channel structure comprising a first plurality of vertically-stacked, horizontal channels connecting the first S/D EPI structure to the second S/D EPI structure in the second horizontal direction through the first portion of the vertical metal gate structure, wherein a top-most portion of the vertical metal gate structure is above a first top-most channel of the first plurality of vertically-stacked, horizontal channels;
a high-K dielectric material disposed between the vertical metal gate structure and each of the first plurality of vertically-stacked, horizontal channels;
a first vertical spacer layer extending in the first horizontal direction and disposed between the vertical metal gate structure and the first S/D EPI structure;
a second vertical spacer layer extending in the first horizontal direction and disposed between the vertical metal gate structure and the second S/D EPI structure; and
a low-K dielectric structure disposed above the top-most portion of the vertical metal gate structure and between the first vertical spacer layer and the second vertical spacer layer.

2. The FET structure of claim 1, wherein the low-K dielectric structure fills a recess formed by the first vertical spacer layer, the second vertical spacer layer, and the top-most portion of the vertical metal gate structure.

3. The FET structure of claim 1, wherein the vertical metal gate structure comprises a gate-all-around (GAA) structure.

4. The FET structure of claim 1, further comprising a frontside inter-layer dielectric (ILD) layer disposed above the vertical metal gate structure, the first S/D EPI structure, and the second S/D EPI structure.

5. The FET structure of claim 1,
wherein a second portion of the vertical metal gate structure is disposed between a third S/D EPI structure and a fourth S/D EPI structure set apart in the second horizontal direction and set apart from the first S/D EPI structure and the second S/D EPI structure in the first horizontal direction and comprising a second channel structure, the second channel structure comprising a second plurality of vertically-stacked, horizontal channels connecting the third S/D EPI structure to the fourth S/D EPI structure in the second horizontal direction through the vertical metal gate structure,
wherein the top-most portion of the vertical metal gate structure is above a second top-most channel of the second plurality of vertically-stacked, horizontal channels.

6. The FET structure of claim 5, wherein the vertical metal gate structure comprises a third portion between the first portion of the vertical metal gate structure and the second portion of the vertical metal gate structure, wherein a top surface of the third portion of the vertical metal gate structure is below a top surface of the first portion of the vertical metal gate structure.

7. The FET structure of claim 6, wherein the top surface of the third portion is below the first top-most channel of the first plurality of vertically-stacked, horizontal channels.

8. A method of fabricating a field effect transistor (FET) structure, the method comprising:
providing a vertical metal gate structure extending in a first horizontal direction and having a first portion disposed between a first source/drain (S/D) epitaxial (EPI) structure and a second S/D EPI structure set apart in a second horizontal direction and comprising a first channel structure, the first channel structure comprising a first plurality of vertically-stacked, horizontal channels connecting the first S/D EPI structure to the second S/D EPI structure in the second horizontal direction through the first portion of the vertical metal gate structure, wherein a top-most portion of the vertical metal gate structure is above a first top-most channel of the first plurality of vertically-stacked, horizontal channels;

providing a high-K dielectric material disposed between the vertical metal gate structure and each of the first plurality of vertically-stacked, horizontal channels;
providing a first vertical spacer layer extending in the first horizontal direction and disposed between the vertical metal gate structure and the first S/D EPI structure;
providing a second vertical spacer layer extending in the first horizontal direction and disposed between the vertical metal gate structure and the second S/D EPI structure; and
providing a low-K dielectric structure disposed above the top-most portion of the vertical metal gate structure and between the first vertical spacer layer and the second vertical spacer layer.

9. The method of claim 8, wherein providing the low-K dielectric structure comprises filling a recess formed by the first vertical spacer layer, the second vertical spacer layer, and the top-most portion of the vertical metal gate structure.

10. The method of claim 8, wherein providing the vertical metal gate structure comprises providing a gate-all-around (GAA) structure.

11. The method of claim 8, further comprising providing a frontside inter-layer dielectric (ILD) layer disposed above the vertical metal gate structure, the first S/D EPI structure, and the second S/D EPI structure.

12. The method of claim 8, further comprising:
providing a second portion of the vertical metal gate structure is disposed between a third S/D EPI structure and a fourth S/D EPI structure set apart in the second horizontal direction and set apart from the first S/D EPI structure and the second S/D EPI structure in the first horizontal direction and comprising a second channel structure, the second channel structure comprising a second plurality of vertically-stacked, horizontal channels connecting the third S/D EPI structure to the fourth S/D EPI structure in the second horizontal direction through the vertical metal gate structure,
wherein the top-most portion of the vertical metal gate structure is above a second top-most channel of the second plurality of vertically-stacked, horizontal channels.

13. The method of claim 12, wherein the vertical metal gate structure comprises a third portion between the first portion of the vertical metal gate structure and the second portion of the vertical metal gate structure, wherein a top surface of the third portion of the vertical metal gate structure is below a top surface of the first portion of the vertical metal gate structure.

14. The method of claim 13, wherein the top surface of the third portion is below the first top-most channel of the first plurality of vertically-stacked, horizontal channels.

* * * * *